(12) United States Patent
Boucher (10) Patent No.: US 7,737,784 B2
(45) Date of Patent: Jun. 15, 2010

(54) SELF CONFIGURING OUTPUT STAGES OF PRECISION AMPLIFIERS

(75) Inventor: Richard Edward Boucher, Santa Clara, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 12/248,196

(22) Filed: Oct. 9, 2008

(65) Prior Publication Data

US 2010/0090766 A1 Apr. 15, 2010

(51) Int. Cl.
H03F 3/18 (2006.01)

(52) U.S. Cl. .................. 330/264; 330/269; 330/278

(58) Field of Classification Search .............. 330/264, 330/269, 278
See application file for complete search history.

(56) References Cited

U.S. PATENT DOCUMENTS

| | | | |
|---|---|---|---|
| 4,329,728 A | | 5/1982 | Welzhofer |
| 5,241,283 A | * | 8/1993 | Sutterlin ................. 330/51 |
| 5,343,166 A | * | 8/1994 | Pass ...................... 330/264 |
| 5,414,314 A | | 5/1995 | Thurber, Jr. |
| 5,424,683 A | * | 6/1995 | Takahashi ............... 330/255 |
| 5,963,067 A | | 10/1999 | Boucher |
| 6,215,356 B1 | | 4/2001 | Servaes et al. |
| 6,930,551 B2 | | 8/2005 | Ivanov et al. |
| 6,970,044 B2 | * | 11/2005 | Inagaki ................... 330/255 |
| 7,012,465 B2 | * | 3/2006 | Manetakis ............... 330/253 |
| 7,064,587 B2 | * | 6/2006 | Pentakota et al. ........ 327/108 |
| 7,408,414 B2 | | 8/2008 | North |

OTHER PUBLICATIONS

"International Search Report and Written Opinion of the International Searching Authority Dated Jan. 7, 2010", International Application No. PCT/US2009/058667.
Anonymous, "Amplifier with output voltage near to VSS", *Research Disclosure*, Mason Publications, Hampshire, GB, No. 391, (Nov. 1, 1996), p. 751.
Fiez, Terri S., et al., "A Family of High-Swing CMOS Operational Amplifiers", *IEEE Journal of Solid-State Circuits*, vol. 24, No. 6, (Dec. 1989), pp. 1683-1687.
Seo, Dongwon , et al., "High-Voltage-Tolerant Analog Circuits Design in Deep-Submicrometer CMOS Technologies", *IEEE Transactions on Circuits and Systems*, vol. 54, No. 10, (Oct. 2007), pp. 2159-2166.

* cited by examiner

*Primary Examiner*—Patricia Nguyen
(74) *Attorney, Agent, or Firm*—Blakely Sokoloff Taylor & Zafman LLP (57) ABSTRACT

Self configuring output stages of precision amplifiers that remain linear when operating into a load that may have a ground reference below the amplifier ground reference, that maintain full amplifier gain while approaching zero output, and that can provide a zero output even when operating into a load that may have a ground reference below the amplifier ground reference, that has a self configuring output stage operable with either a mid-rail or ground reference below amplifier ground, and which maintain a high output impedance when not selected even when the output is above the amplifier supply voltage, or when not powered, thereby allowing amplifier outputs from un-powered amplifiers or amplifiers operating at lower supply voltages to be connected in common for multiplexing to a common load.

10 Claims, 4 Drawing Sheets

Fully Self-Configuring Amplifier Output Stage with Sensed-Current Output

Figure 1 (Prior Art): Amplifier Illustrating Sensed-Current Output

Figure 2a: Fully Self-Configuring Amplifier Output Stage with Sensed-Current Output Figure 2b: Simplified High Impedance Cascoded-Current Mirror Configuration Figure 3: Typical Rail-to-Rail Output Stage with Sensed-Current Output Figure 4: PMOS Output Stage with Sensed-Current Output Figure 5: Typical Rail-to-Rail Output Stage with Sensed-Current Output Parasitic MOS Body Diodes shown Figure 6: Amplifier A2 Output Disable

US 7,737,784 B2

SELF CONFIGURING OUTPUT STAGES OF PRECISION AMPLIFIERS

BACKGROUND OF THE INVENTION

1. Field of the Invention

The present invention relates to amplifiers.

2. Prior Art

This invention applies to an amplifier class with a high impedance output that sources current to an external load resistor to set the amplifier output voltage. It is applicable to but not limited to precision amplifiers where high gain accuracy and low offset are important. It is also useful in multiplexed output applications in which a single external load resistor is shared by many amplifier outputs where it is convenient for the amplifiers to be powered at various supply voltages or to have some of the multiplexed amplifiers powered down.

There is a first set of applications where it is useful for the amplifier to have a bi-directional output where the zero value is equal to an external reference voltage, Vref, near Vcc/2 (supply voltage divided by 2). In these applications the external load resistor is tied to Vref. The most positive output is near Vcc, and the most negative output is near G (ground). There is a second set of applications that are unidirectional where the zero output is at G, exactly. In these applications the load resistor is tied to G, and the most positive output is near Vcc. These two sets of applications place different requirements on the output structure of the amplifier and, as will be described later, are not generally possible in a single, monolithic amplifier IC.

An incentive for having an external load resistor in precision applications is to remove the error that would otherwise be introduced due to minor ground shifts between the amplifier and the device sensing the amplifier output. In many of these applications there may be a great distance between the two ICs and positive and negative ground shifts can be significant relative to the error budget of the system. In these applications, when G is used as the reference voltage, it is necessary for the output to be able to go below local IC ground.

Another set of problems particular to amplifiers with unidirectional outputs is maintaining constant gain while approaching zero output, and achieving an absolute zero output, which requires being able to completely turn off the current going to the external load resistor.

An additional incentive for having an external load resistor is that multiple amplifiers may share a single load resistor in a multiplexed arrangement where a single amplifier is enabled while all others are disabled. This is useful in an application where the outputs of many amplifiers are read by a single Analog to Digital Converter (ADC). A problem in this case is that all amplifiers in the multiplexed system must always remain powered at the same supply voltage. If a single amplifier were powered down (power supply terminal is below normal system supply voltage or near G) the multiplexed output would be shorted through the body diode of the output driver of the powered down amplifier. While it is common in industrial communication and interface products to protect against this problem, it is not common in precision amplifiers. U.S. Pat. No. 5,414,314 by Thurber, Jr. and assigned to the assignee of the present invention covers a high-side (PMOS) connection and a low-side (NMOS) connection, both of which provide a means for isolating an output from the supply and from ground. U.S. Pat. No. 5,963,067 by Boucher and assigned to the assignee of the present invention provides a means for active rectification and makes use of the connection covered by Thurber, Jr.

BRIEF DESCRIPTION OF THE DRAWINGS

FIG. 6 illustrates the output-disable circuit for the amplifier A2 of FIG. 2a.

DETAILED DESCRIPTION OF THE PREFERRED EMBODIMENTS

Figure 1:
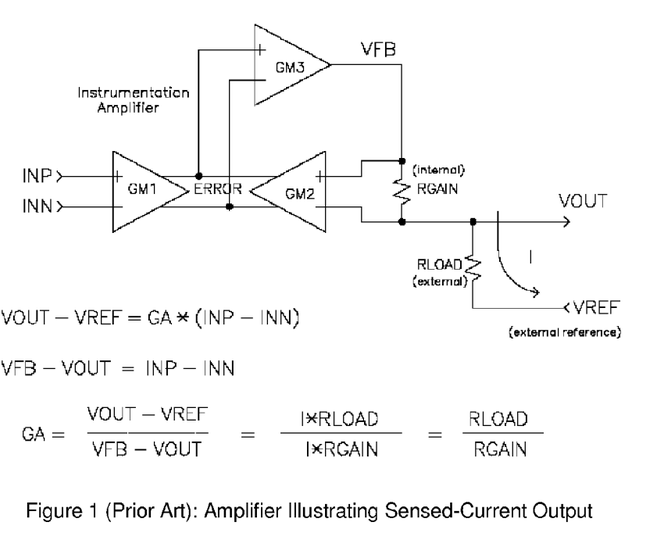
FIG. 1 illustrates a complete prior art amplifier system from differential input INP-INN to differential output VOUT-VREF.

FIG. 1 shows a complete amplifier system from differential input INP-INN to differential output VOUT-VREF. The only portion of the amplifier system of FIG. 1 not contained in the integrated circuit is the external resistor RLOAD. The voltage VREF is set externally. The IC is a transconductance amplifier. The output is the current "I" which is proportional to the differential input INP-INN. When the current "I" flows through RLOAD it creates the differential voltage VOUT-VREF.

Figure 2A:
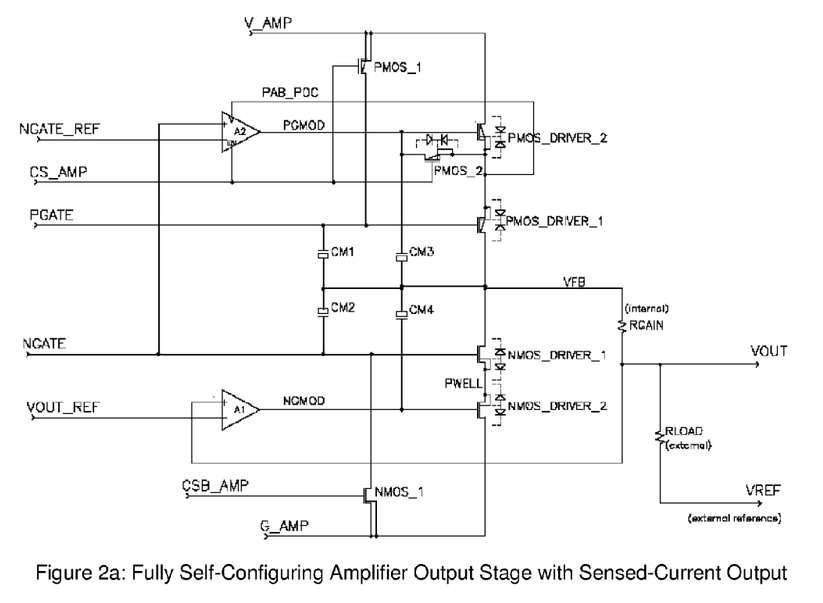
FIG. 2a is the schematic of an exemplary class AB amplifier output structure comprising all aspects of this invention.

FIG. 2a is the schematic of an amplifier output structure comprising all aspects of this invention. This output structure is representative of the output stage in GM3 of FIG. 1.

The following discussion will pertain to FIG. 2a and will frequently refer to the amplifier output as the output stage. As described earlier the voltage VREF is an externally set voltage. It will typically be either a nominal voltage that is half way between the supply voltage and ground (mid-rail), or at ground. When VREF is mid-rail the output (VOUT) can be positive or negative with respect to VREF, and this is referred to as bi-directional operation. When it is at ground, only positive outputs are possible and this is referred to as unidirectional operation. The resistor RLOAD is external to the IC to obtain full precision by eliminating errors due to ground shift; and to allow the flexibility of obtaining both bi-directional and unidirectional operation.

The output stage under discussion is sometimes referred to as a Rail-to-Rail output stage and the application of the invention is general in that the output stage may be configured as high impedance cascoded-current mirror output, a single transistor inverting gain stage, or as Class AB output. The remainder of discussion will be primarily limited to the Class AB output because implementation of the invention is most intuitive with the Class AB output without additional circuit considerations to maintain precision. In addition, the discussion will only consider static or DC operation. When there is mention of a transition, it should be interpreted as a gradual sequence of static conditions.

In a Class AB output the gate voltages PGATE and NGATE would be controlled with one of various forms of Class AB bias circuits preceding FIG. 2a. Details of the operation of Class AB bias circuits are available in the technical literature and are not pertinent to this discussion, other than the fact that in a Class AB output neither output driver is ever completely off. Instead, when one driver is engaged the complementary driver has a small bias current that remains. The capacitors CM1 and CM2 are referred to as Miller capacitors and, while not pertinent to this discussion, are typically required for stability in a Class AB circuit. All of this behavior is well documented in the literature.

During normal operation (non-extreme conditions) the PMOS_DRIVER_2 and NMOS_DRIVER_2 would be fully on with the gate voltage PGMOD at G_AMP and the complementary gate voltage NGMOD at V_AMP. To obtain a positive voltage across RLOAD the gate voltage PGATE is brought below the PMOS threshold to turn on PMOS_DRIVER_1. At this time NGATE is held approximately at the NMOS threshold, and the NMOS_DRIVER_1 is kept at the bias current level. To obtain a negative voltage across RLOAD the gate voltage NGATE is brought above the NMOS threshold to turn on the NMOS_DRIVER_1. At this time PGATE is held approximately at the PMOS threshold, and the PMOS_DRIVER_1 is kept at the bias current level.

In FIG. 2a there are diode pairs shown with PMOS_DRIVER_1, PMOS_DRIVER_2, NMOS_DRIVER_1, NMOS_DRIVER_1, and PMOS_2. These are the parasitic body diodes that are present in all MOS devices, and they are implicitly connected between the source and body, and the drain and body of all MOS devices. They are shown only in particular devices in this figure where they aid the discussion. They point in the direction of positive current flow when there is adequate forward voltage bias (usually greater than 300 mV). With forward bias the current flows from the P-type material to the N-type material. In a PMOS device the source and drain are P-type and the body is N-type. Conversely, for an NMOS device the source and drain are N-type, and the body is P-type. FIG. 2a explicitly shows the connection of each MOS body, as this will be useful in later discussion.

Obtaining a Zero Output when Vref is Equal to G_Amp ±100 mV

This discussion will avoid the issue of amplifier input offset by referring to the output voltage that the amplifier is seeking, assuming that the amplifier input is appropriate to obtain that output, taking into account amplifier gain and input offset. The concern for obtaining very low output voltages is appropriate in precision systems with low input offset voltage (less than 100 uV) combined with high gain (greater than 50V/V).

Again, VREF is the reference voltage used differentially with VOUT to obtain the output of the system. The operating condition where VREF is exactly equal to G_AMP is a singular condition in the continuous transition from VREF greater than G_AMP to VREF less than G_AMP. For this reason this discussion will include first the condition where VREF is greater than G_AMP, followed by the condition where VREF is less than G_AMP.

Figure 3:
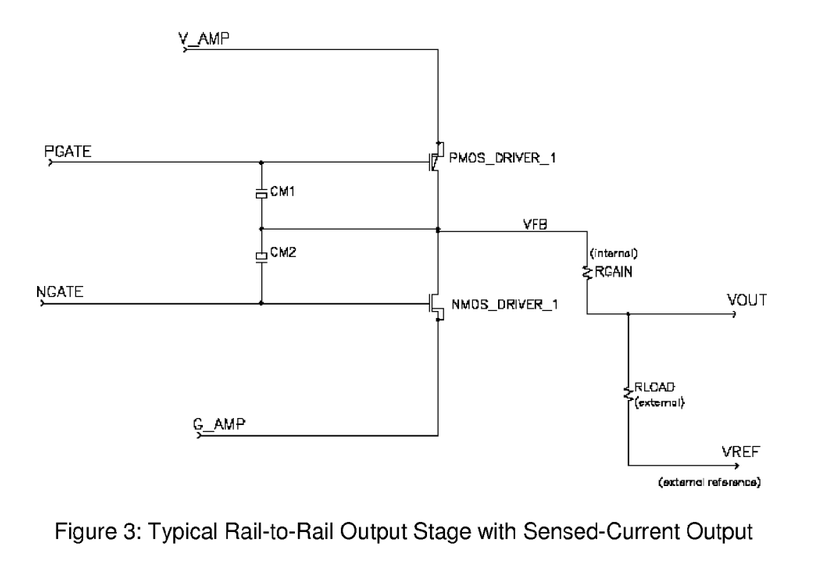
FIG. 3 illustrates a partial typical Rail-to-Rail Output Stage.

FIG. 3 shows a typical Rail-to-Rail Output Stage with only the components essential to this discussion. The first operating condition is where VREF is greater than G_AMP. Assume that VREF is 100 mV above G_AMP. When the desired differential output VOUT-VREF is very small (e.g. ±10 mV or less) or zero the amplifier can remain linear, with proper phase control of PGATE and NGATE, because VFB and VOUT can swing above or below VREF, while staying at a higher voltage than G_AMP, resulting in a positive or negative output. In this operating condition both the PMOS and NMOS drivers are passing the normal bias current and in addition one of the drivers can adjust up and the other down to achieve the appropriate output current to obtain the required output differential voltage across the external resistor RLOAD.

The second operating condition is where VREF is less than G_AMP. In this case assume that VREF is 100 mV below G_AMP. When the desired differential output VOUT-VREF is very small (e.g. ±10 mV or less) or zero the amplifier will not remain linear because the output stage has no way to pull VFB below G_AMP. When VFB needs to be below G_AMP to obtain the correct output, the NMOS driver will become phase-inverted, that is when the amplifier wants the differential output to decrease it will increase the voltage of the gate drive NGATE. This will turn on the NMOS driver harder, pulling VFB and VOUT to G_AMP, which is the wrong direction, eventually turning on with maximum strength, with the output in saturation, and a significant voltage error at the output.

In the condition described above it is necessary to prevent current flow through NMOS_DRIVER_1 to prevent this saturation condition and resulting error. This is the purpose of amplifier A1 that is driving the gate voltage NGMOD in FIG. 2a. In the example above, it is possible to set an arbitrary voltage threshold, say 150 mV, above G_AMP such that when VOUT drops below that threshold, NMOS_DRIVER_2 turns off. In FIG. 2a, VOUT_REF is that threshold voltage. A1 is a linear amplifier, not a comparator, so that the NMOS driver is shut off gracefully, not abruptly. The capacitor CM4 is referred to as a Miller capacitor and, while it is not pertinent to this discussion, is typically required for stability.

Take the case where VREF is within ±100 mV of G_AMP. When VOUT is well above VOUT_REF the gate voltage NGMOD is at V_AMP and NMOS_DRIVER_2 is on very hard with very low series resistance. NGATE is at the NMOS threshold and NMOS_DRIVER_1 is conducting only the Class AB bias current. As the amplifier differential output VOUT-VREF decreases toward zero, VOUT eventually descends through the voltage VOUT_REF. At that point NGMOD is brought from the voltage V_AMP through the NMOS threshold voltage, which gradually turns off NMOS_DRIVER_2 in a linear fashion. When NMOS_DRIVER_2 is turned off, the bias current that normally flows in NMOS_DRIVER_1 is also turned off. When this occurs the current flow is from the PMOS drivers, through the resistors RGAIN and RLOAD into VREF. The amplifier detects this as a slight positive disturbance in VOUT and by virtue of feedback through GM2 of FIG. 1 the amplifier compensates by raising PGATE enough to reduce the current in the PMOS drivers by that same amount. The gate voltage NGATE remains virtually unchanged through all this as though it were maintaining the bias current through the NMOS drivers. This is because the amplifier has no other information telling it that the NMOS drivers are off.

In the discussion several paragraphs above, FIG. 3 was used to show that the first operating condition where VREF is above G_AMP is not problematic for the typical Rail-to-Rail output stage, but the second operating condition where VREF is below G_AMP leads to phase-inversion and is a problem, so the remainder of this discussion will look at FIG. 2a considering the latter case, and demonstrate how this invention solves the phase-inversion problem. Therefore, the existing situation now has VREF 100 mV below G_AMP, VOUT below VOUT_REF, NGMOD low (essentially at G_AMP), NMOS_DRIVER_2 off, NGATE at the NMOS threshold voltage, and NMOS_DRIVER_1 on but passing no current. As the differential output is required to decrease, VOUT will further decrease, and VFB and VOUT will go below G_AMP.

VOUT is decreasing because of the current path through the external resistor RLOAD, and because the PMOS drivers are supplying progressively less current. With NMOS_DRIVER_1 on, the voltage at the node PWELL will follow VFB below G_AMP, but because NMOS_DRIVER_2 is off, no current will flow and PWELL readily follows. NGMOD is at G_AMP but as PWELL continues to follow VFB below G_AMP it is important to note that, because the gate of NMOS_DRIVER_2 is at G_AMP and the source is being pulled below G_AMP, the gate-to-source voltage is increasing, although remaining very much sub-threshold. Since the gate-to-source voltage would need to exceed 500 mV before the current level would become an issue there is substantial margin to the 100 mV ground bounce objective. Note that because of the direction of the body diodes, PWELL can continue to go below G_AMP and current will not flow around NMOS_DRIVER_2. The diode that provides the blocking is the lower diode on NMOS_DRIVER_2, which is pointing toward G_AMP. In summary, no current flows through the NMOS drivers and the system uses only PGATE to control VOUT-VREF.

Obtaining a Zero Output without an Active Pull-Down Device

Figure 4:
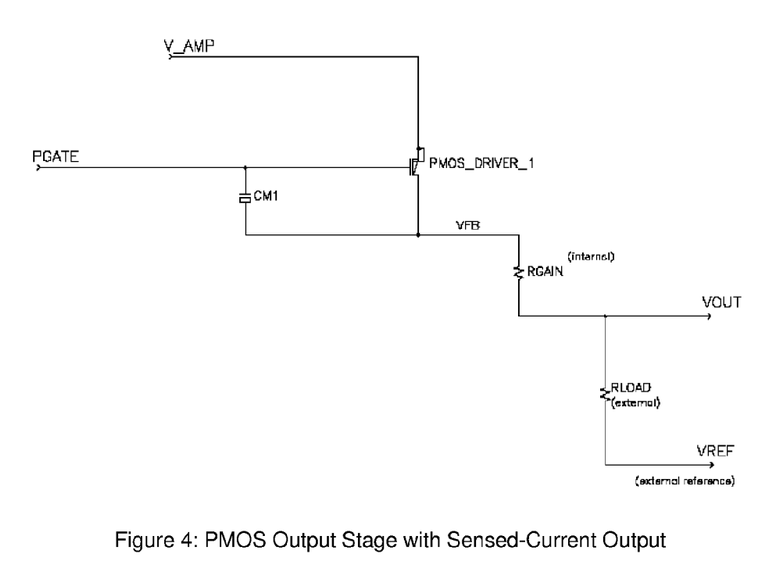
FIG. 4 illustrates a typical rail-to-rail ground referenced output driver.

Obtaining a very small (sub-millivolt) or zero output is an extreme condition for a ground-referenced amplifier output stage without an active pull-down device. In this condition the typical rail-to-rail ground referenced output driver as shown in FIG. 4 cannot be completely turned off in a linear fashion. The circuit controlling PGATE becomes saturated and the gain decreases rapidly. This is the case in the typical Class AB output as well as the high impedance cascoded current mirror construction because in each case the output is attempting to provide a mirrored version of a very small current. Even as the current goes to essentially zero and device matching degrades substantially, the controlling devices are at an increasingly lower threshold condition, never completely off, and while the output driver is trying to mirror this condition, gain is essentially zero, response times are very long and leakage dominates. The single transistor inverting gain-stage construction is able to avoid this problem. The problem is that the PMOS driver enters a condition of weak-inversion where it is nearly off but continues to leak a small amount of current. In this condition, because of the lack of gain in the output stage, the effective gain of the amplifier has decreased to the point of no longer responding to the output error.

Because the leakage current cannot be controlled, and progressively dominates, amplifier gain goes to zero and the output current and thus the output voltage never go to zero. This condition is extremely process and temperature dependent, that is the magnitude of the leakage current will vary from lot to lot, and will always increase significantly with temperature.

The output stage of FIG. 2a uses the addition of amplifier A2, and the reference voltage NGATE_REF, to correct this problem. NGATE_REF is an arbitrary voltage that is above the normal operating voltage of NGATE, corresponding to the highest useful operating current condition in NMOS_DRIVER_1, but that is also conveniently below V_AMP. The normal state of amplifier A2 is with the input NGATE below NGATE_REF and the output PGMOD at G_AMP. This causes PMOS_DRIVER_2 to be on very hard providing very little series resistance. The capacitor CM3, like CM4, is a Miller capacitor and is typically required for stability. To briefly summarize the state of the lower portion of the circuit, VOUT is below VOUT_REF so the gate drive NGMOD is low and NMOS_DRIVER_2 is off. Prior to entering the saturation condition with respect to the control of PGATE described above the gate drive NGATE is still at a voltage level near the NMOS threshold. NMOS_DRIVER_2 is off so the NMOS drivers are passing no current. As the system attempts to achieve a lower output current and lower output voltage, it attempts to pull the gate drive PGATE above the PMOS threshold but as PMOS_DRIVER_1 begins to enter weak-inversion the circuit controlling PGATE is beginning to saturate and lose gain. To compensate the system will cause NGATE to begin to rise turning NMOS_DRIVER_1 on harder, but because NMOS_DRIVER_2 is off, no current flows in either NMOS driver. The response of the amplifier is to further increase NGATE, but still no current flows, but when NGATE rises above the threshold voltage set by NGATE_REF, the gate drive PGMOD will begin to rise from G_AMP crossing the PMOS threshold of PMOS_DRIVER_2, and in doing so will begin to put PMOS_DRIVER_2 in weak-inversion. From this point on PGATE remains virtually static, because the circuit controlling PGATE has saturated, holding PMOS_DRIVER_1 in weak-inversion. But NGATE has not saturated and the gate drive PGMOD has the gain boost of the amplifier A2 to maintain the over all gain of the system during this low output current condition. This increased gain is beneficial in maintaining system gain and in keeping the system linear while controlling sub-millivolt outputs. PGMOD has increased gain relative to PGATE or NGATE but in addition it can swing well above the PMOS threshold voltage to linearly drive PMOS_DRIVER_2 into lower levels of weak-inversion and to completely turn off PMOS_DRIVER_2. This gives the system the ability to maintain system gain and modulate the differential output at extremely low current levels and to completely turn it off, independent of process variations or temperature, obtaining a zero output.

In the description of FIG. 2a, it was pointed out that amplifier A1 was an amplifier, not a comparator. Actually both amplifiers A1 and A2 should be amplifiers and not comparators. In particular, amplifier A1 turns off NMOS_DRIVER_2 as VOUT approaches G_AMP from the positive side to prevent the turning on NMOS_DRIVER_2 hard, which in turn would prevent VOUT from ever going below G_AMP. A switching signal for amplifier A1 as provided by a comparator would accomplish the same result, but inject a transient in the amplifier. Amplifier A2, on the other hand, controls the flow of leakage current of PMOS_DRIVER_1, and essentially takes over control of the current through the output stage maintaining system gain and linearity in response to an input to the amplifier, turning the pull-up circuitry completely off when the input so indicates.

Obtaining High Output Impedance when the Output is Disabled and the Output Voltage is Above the Supply Voltage, or the Supply is Powered Down There are applications where multiple amplifier outputs are tied to a single load resistor as a means of multiplexing into a single receiving circuit. This receiving circuit will commonly be an Analog to Digital Converter (ADC), but it could easily be something else. In such a system a single multiplexed output is enabled to drive the load resistor while all others are disabled. When disabled it is necessary that these outputs be high impedance, that is that they neither sink or source current to the load resistor. In some instances it is possible that one or more of the circuits in this multiplexed arrangement will have supply voltages that are at a lower voltage level than others. It is also possible that one or more of the multiplexed devices will be powered-down while others remain powered with outputs disabled. In all these cases it is necessary that the outputs be capable of maintaining high impedance to output voltages above the local supply voltage when disabled, or when powered down.

Often MOS devices are symmetrical in semiconductor doping densities and in shape, but not always. The source of a symmetrical PMOS device is commonly distinguished as the P+ terminal at the higher voltage during normal operation, unless the body is connected to one of the terminals, in which case that terminal is then referred to as the source. In the case when current flows from a PMOS drain to source the device is said to be reverse connected. In a non-symmetrical device the drain is commonly distinguished as the more lightly doped terminal and current can still flow in either direction. The PMOS threshold is a function of the gate-to-source voltage and the gate-to-body voltage where the device begins to turn on. While the threshold is referred to as gate-to-source it is in fact the voltage between the gate and the terminal that is at the higher voltage.

When the body of the PMOS device is connected to the source, the source-to-body diode is shunted (bypassed) by that connection. When the drain is pulled to lower voltages relative to the source, the drain-to-body diode is reverse biased and blocks current from flowing around the MOS device, allowing the device current to be controlled by the source-to-gate voltage.

Figure 5:
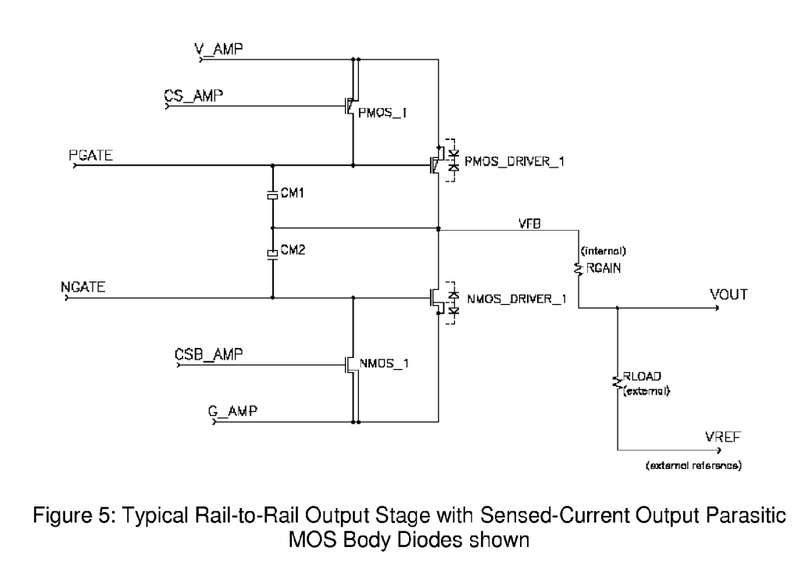
FIG. 5 is identical to FIG. 3 except that the parasitic MOS body diodes are shown on the output drivers and a means for disabling the output drivers is provided.

FIG. 5 is identical to FIG. 3 except that the parasitic MOS body diodes are shown on the output drivers and the MOS devices PMOS_1 and NMOS_1 are added to disable the output stage. In both the PMOS_DRIVER_1 and the NMOS_DRIVER_1 the body connection is tied to the source of the device. Normally the voltage bias at the output drivers is such that the parasitic diodes block the flow of current and the MOS device is able to control current flow through the circuit. When the voltage bias across the MOS body diodes is sufficiently reversed (>300 mV), current will flow through the body diode and around the MOS device.

In FIG. 5, during normal operation VFB is between V_AMP and G_AMP, and the gate voltages PGATE and NGATE control the flow of current through the drivers. To disable the drivers CS_AMP is pulled low and CSB_AMP is pulled high. In doing so, PGATE is pulled up to V_AMP by PMOS_1 and NGATE is pulled down to G_AMP by NMOS_1, thereby turning off the corresponding driver. As long as VFB remains between V_AMP and G_AMP during this disabled condition no current will flow to or from the external load resistor. Typically the forward bias required to initiate the flow of leakage current through a body diode is on the order of 300 mV, thus if VFB is pulled more than 300 mV above V_AMP, leakage current will begin to flow into V_AMP. At larger forward bias voltages exponentially higher levels of current will flow. In the case where the device is powered down, if V_AMP were to drop to 0V relative to G_AMP, significant current could flow and VFB would be clamped to 600 mV to 800 mV above G_AMP.

In FIG. 2a, as in FIG. 5, CS_AMP is pulled low and CSB_AMP is pulled high to disable the drivers. In doing so, PGATE is pulled up to V_AMP by PMOS_1 and NGATE is pulled down to G_AMP by NMOS_1, thereby turning off the corresponding driver. What is different in FIG. 2a is the addition of PMOS_DRIVER_2 in series with PMOS_DRIVER_1, and the addition of PMOS_2. During normal operation when the output is enabled, the gate of PMOS_2 is at V_AMP, and PMOS_2 is therefore off. PGMOD, which is the output of amplifier A2, and enabled by CS_AMP, is allowed to swing as described earlier to control PMOS_DRIVER_2. When the drivers and amplifier A2 output are disabled by CS_AMP low, PMOS_2 is turned on and ties PGMOD, the gate of PMOS_DRIVER_2, to PAB_POC. PAB_POC is the common node that is connected to the source and body of PMOS_DRIVER_1, PMOS_DRIVER_2 and PMOS_2.

Figure 6:
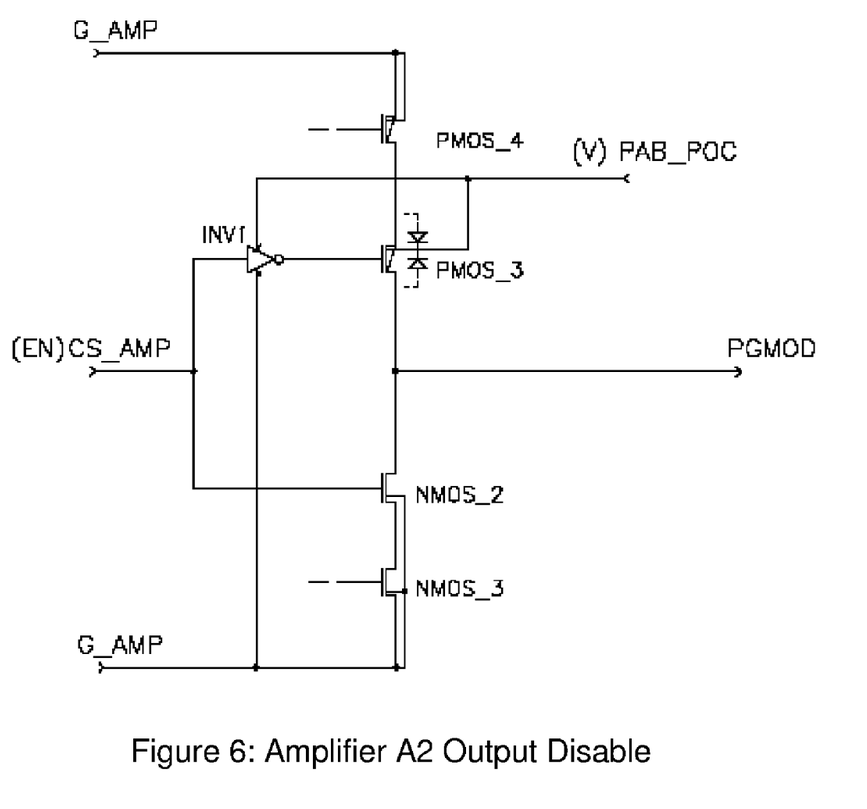

FIG. 6 is the output-disable circuit for the amplifier A2. When CS_AMP is low, the output drivers of FIG. 2a are disabled, and the output of amplifier A2 is also disabled by turning off NMOS_2 directly and PMOS_3 through the inverter INV1. INV1 is a simple logic inverter that draws no current after changing state. INV1 is supplied by PAB_POC, which causes the gate of PMOS_3 to rise to PAB_POC and to remain at that voltage to keep PMOS_3 in the off state. With amplifier A2 output disabled, PGMOD can range from G_AMP up to PAB_POC without sourcing or sinking current.

Returning to FIG. 2a, in the reversed biased condition where PMOS_DRIVER_1 is off and VFB rises 300 mV above V_AMP, VFB will forward bias the body diode of PMOS_DRIVER_1 and will cause PAB_POC to rise with it, lagging approximately 300 mV. PAB_POC will rise above V_AMP but current will not flow through PMOS_DRIVER_2 because its gate is tied to its (higher voltage) source by PMOS_2. Current also will not bypass PMOS_DRIVER_2 because it is blocked by the upper body diode, which is pointing away from V_AMP. In this condition V_AMP can be at 0V relative to G_AMP, and still no current will flow through the PMOS drivers.

To summarize, in FIG. 2a, CS_AMP is pulled low and CSB_AMP is pulled high to disable the drivers, and to disable the output of A2, which allows PGMOD to float between G_AMP and PAB_POC, and PGMOD is tied to PAB_POC by PMOS_2. This connection results in a state where PMOS_DRIVER_2 is tied off, PAB_POC is within ±300 mV of VFB, V_AMP can be at any safe voltage level from G_AMP to above VFB and no current will flow. Because CS_AMP and CSB_AMP are generated in the system supplied by V_AMP they will be constrained to be between V_AMP and G_AMP. In the case when the device is powered down and V_AMP is at or near 0V, CS_AMP and CSB_AMP will also be near 0V, and the output drivers will remain in the high impedance state described above, allowing VFB and VOUT to be pulled up to any safe voltage levels not exceeding process limits.

Figure 2B:
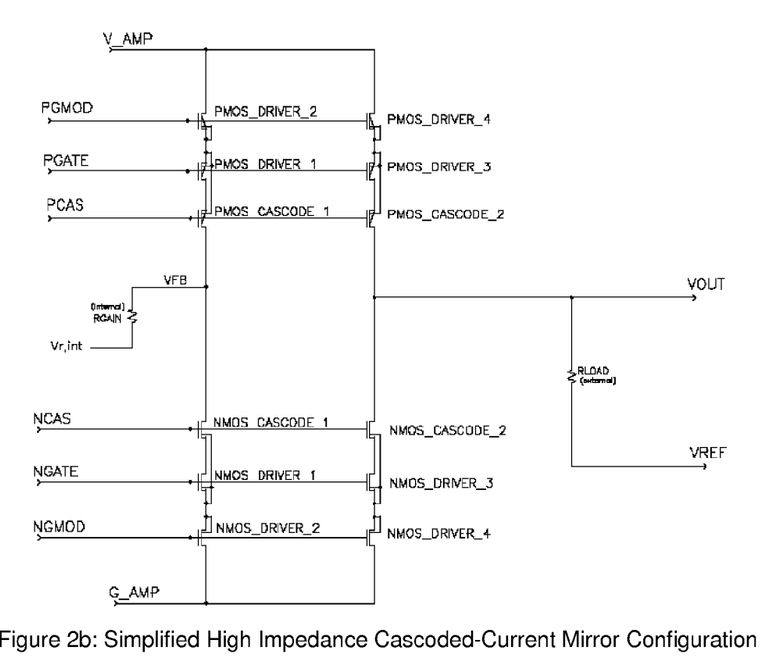
FIG. 2b illustrates an output stage using high impedance cascoded-current mirror output in accordance with the present invention.

As previously mentioned, the output stage may be configured as a Class AB output, as high impedance cascoded-current mirror output, or a single transistor inverting gain stage. An output stage using high impedance cascoded-current mirror output in accordance with the present invention is shown in FIG. 2b. In this Figure, PCAS and NCAS are cascode bias voltages, PGATE and NGATE are the input signals and PMOD and NMOD are the equivalent of PMOD and NMOD of FIG. 2a. Like the class AB stage of FIG. 2a, the cascoded-current mirror stage also provides a pull-up and pull-down output capability.

In a single transistor inverting gain stage, which may be used if the output stage only needs to source current, not source and sink current, the NGATE signal would not be needed because of the lack of an NMOS pull down device, but still it would be provided for controlling the virtual crossover network needed to maintain system gain and linearity at low output current levels and near 0V output voltage levels, and to turn the pull-up circuitry completely off when the input so indicates. In addition the disable circuitry of FIG. 2a as it applies to the pull-up portion of the figure, also applies to the single transistor inverting gain stage to maintain high impedance at the output when disabled, allowing the output to be pulled above V_AMP, and allowing V_AMP to go to 0V.

Thus in amplifiers having both pull-up circuitry and pull-down circuitry, current to the pull-down circuitry is gradually turned off when the output stage output approaches a voltage of the amplifier ground rail from a positive voltage relative to the amplifier ground rail, and to turn off current to the pull-down circuitry before the output stage output reaches a voltage of the amplifier ground rail. This prevents the pull-down circuitry from sourcing current to an output load, which would prevent the voltage across the output load from reaching zero when the output load is referenced to a ground potential less than the amplifier ground. At the same time, the circuitry coupled to the pull-up circuitry gradually turns off current to the pull-up circuitry responsive to an input to the output stage, and to turn off current to the pull-up circuitry responsive to a corresponding input to the output stage to allow an output stage output voltage equal to that of a ground reference that is less than the amplifier ground rail. In addition, a select signal assures that current to the pull-up circuitry is turned off when the amplifier is not selected, so that the amplifier output will be very high impedance when the amplifier is not selected, even if the amplifier is powered down. A select signal also turns off the pull-down circuitry to allow the amplifier output to go at least somewhat lower than the amplifier ground reference without sourcing current to the amplifier output. This allows the direct multiplexing of amplifier outputs, such as for inputs to an ADC.

Thus the present invention has a number of aspects, which aspects may be practiced alone or in various combinations or sub-combinations, as desired. While preferred embodiments of the present invention have been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. An amplifier output stage for operating from a positive rail and an amplifier ground rail, comprising:
    first pull-up circuitry and second pull-down circuitry coupled to an output stage output;
    the first pull-up circuitry being coupled to the positive rail through third circuitry, and the second pull-down circuitry being coupled to the amplifier ground rail through fourth circuitry;
    the fourth circuitry being configured to gradually turn off current to the pull-down circuitry when the output stage output approaches a voltage of the amplifier ground rail from a positive voltage relative to the amplifier ground rail, and to turn off current to the pull-down circuitry before the output stage output reaches a voltage of the amplifier ground rail;
    the third circuitry, including amplification, coupled to the pull-up circuitry to gradually turn off current to the pull-up circuitry responsive to an input to the output stage to maintain output stage gain at progressively lower output stage outputs as the output stage output is approaching the voltage of the ground reference, and to turn off current to the pull-up circuitry responsive to a corresponding input to the output stage to allow an output stage output voltage equal to that of a ground reference that is less than the amplifier ground rail;
    whereby the amplifier has a self configuring output stage operable with either a mid-rail or ground reference that may be below the amplifier ground rail.

2. The amplifier output stage of claim 1 wherein the third circuitry includes at least one PMOS transistor and the fourth circuitry includes at least one NMOS transistor, each transistor having a source, a drain, a gate and a body, the body of each transistor being connected to its source, each PMOS transistor having its drain connected to the positive rail and its source and body connected to the pull-up circuitry, each NMOS transistor having its drain connected to the amplifier ground rail and its source and body connected to the pull-down circuitry, and further comprising select circuitry for connecting the gate of each PMOS transistor to its source and body and turning off the pull-up circuitry when the amplifier is not selected.

3. The amplifier output stage of claim 1 wherein the third circuitry includes at least first, second and third PMOS transistors and the fourth circuitry includes at least a first NMOS transistor, each transistor having a source, a drain, a gate and a body, the first PMOS transistor having its drain connected to the positive rail and its source and body connected to the pull-up circuitry, the first NMOS transistor having its drain connected to the amplifier ground rail and its source and body connected to the pull-down circuitry, and
    wherein the first pull-up circuitry is responsive to a pull-up input signal and the second pull-down circuitry is responsive to a pull-down input signal;
    the second PMOS transistor having its source and body coupled to the source and body of the first PMOS transistor, its drain coupled to the gate of the first PMOS transistor and to the output of a first amplifier and its gate coupled to a first select input and to the gate of the third PMOS transistor, the source and body of the third PMOS transistor being coupled to the positive power supply rail and its drain coupled to turn off the pull-up circuitry, the first amplifier having a supply coupled to the source and body of the first PMOS transistor, a positive input coupled to the pull-down input signal and a negative input coupled to a first reference signal.

4. The amplifier output stage of 3 wherein fourth circuitry also includes a second NMOS transistor and a second amplifier, the second NMOS transistor having a source, a drain, a gate and a body, the first NMOS transistor having its gate connected to the output of a second amplifier, the second NMOS transistor having its gate coupled to a second select input, its source and body coupled to the amplifier ground rail and its drain coupled to the pull-down input signal, the second amplifier having a negative input coupled to an output reference voltage, a positive input coupled to the amplifier output voltage and an output coupled to the gate of the first NMOS device.

5. The amplifier output stage of claim 4 wherein the second select input is the inverse of the first select input.

6. An amplifier output stage for operating from a positive rail and an amplifier ground rail comprising:
    first pull-up and second pull-down circuitry coupled to an output stage output, the first pull-up circuitry and the second pull-down circuitry each having output stage inputs for operating the output stage as a class AB output stage;
    the first pull-up circuitry being coupled to the positive rail through third circuitry, and the second pull-down circuitry being coupled to the amplifier ground rail through fourth circuitry;
    the fourth circuitry being configured to gradually turn off current to the pull-down circuitry when the output stage output approaches a voltage of the amplifier ground rail from a positive voltage relative to the amplifier ground rail, and to turn off current to the pull-down circuitry before the output stage output reaches a voltage of the ground rail;

the third circuitry, including amplification, coupled to the pull-up circuitry to gradually turn off current to the pull-up circuitry responsive to an input to the output stage to maintain output stage gain at progressively lower output stage outputs as the output stage output is approaching the voltage of the ground reference, and to turn off current to the pull-up circuitry responsive to a corresponding input to the output stage to allow an output stage output voltage to equal that of a ground reference that is less than the amplifier ground rail;

whereby the amplifier has a self configuring output stage operable with either a mid-rail or ground reference that may be below the amplifier ground rail.

7. The amplifier output stage of claim 6 wherein the third circuitry includes at least one PMOS transistor and the fourth circuitry includes at least one NMOS transistor, each transistor having a source, a drain, a gate and a body, the body of each transistor being connected to its source, each PMOS transistor having its drain connected to the positive rail and its source and body connected to the pull-up circuitry, each NMOS transistor having its drain connected to the amplifier ground rail and its source and body connected to the pull-down circuitry, and further comprising select circuitry for connecting the gate of each PMOS transistor to its source and body and turning off the pull-up circuitry when the amplifier is not selected.

8. The amplifier output stage of claim 6 wherein the third circuitry includes at least first, second and third PMOS transistors and the fourth circuitry includes at least a first NMOS transistor, each transistor having a source, a drain, a gate and a body, the first PMOS transistor having its drain connected to the positive rail and its source and body connected to the pull-up circuitry, the first NMOS transistor having its drain connected to the amplifier ground rail and its source and body connected to the pull-down circuitry, and wherein the first pull-up circuitry is responsive to a pull-up input signal and the second pull-down circuitry is responsive to a pull-down input signal;

the second PMOS transistor having its source and body coupled to the source and body of the first PMOS transistor, its drain coupled to the gate of the first PMOS transistor and to the output of a first amplifier and its gate coupled to a first select input and to the gate of the third PMOS transistor, the source and body of the third PMOS transistor being coupled to the positive power supply rail and its drain coupled to turn off the pull-up circuitry, the first amplifier having a supply coupled to the source and body of the first PMOS transistor, a positive input coupled to the pull-down input signal and a negative input coupled to a first reference signal.

9. The amplifier output stage of 8 wherein fourth circuitry also includes a second NMOS transistor and a second amplifier, the second NMOS transistor having a source, a drain, a gate and a body, the first NMOS transistor having its gate connected to the output of a second amplifier, the second NMOS transistor having its gate coupled to a second select input, its source and body coupled to the amplifier ground rail, and its drain coupled to the pull-down input signal, the second amplifier having a negative input coupled to an output reference voltage, a positive input coupled to the amplifier output voltage and an output coupled to the gate of the first NMOS device.

10. The amplifier output stage of claim 9 wherein the second select input is the inverse of the first select input.

\* \* \* \* \*